United States Patent
Arnold

(10) Patent No.: US 11,817,945 B2
(45) Date of Patent: Nov. 14, 2023

(54) SYSTEM FOR CONTINUOUS RECORDING AND CONTROLLABLE PLAYBACK OF INPUT SIGNALS

(71) Applicant: Tektronix, Inc., Beaverton, OR (US)

(72) Inventor: Shane L. Arnold, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 108 days.

(21) Appl. No.: 17/114,266

(22) Filed: Dec. 7, 2020

(65) Prior Publication Data

US 2021/0176144 A1 Jun. 10, 2021

Related U.S. Application Data

(60) Provisional application No. 62/944,960, filed on Dec. 6, 2019.

(51) Int. Cl.
| | |
|---|---|
| *H04L 43/04* | (2022.01) |
| *G01R 13/02* | (2006.01) |
| *G06F 3/05* | (2006.01) |
| *G11B 20/00* | (2006.01) |
| *H04L 43/02* | (2022.01) |
| *G06F 3/04847* | (2022.01) |

(52) U.S. Cl.
CPC .......... *H04L 43/04* (2013.01); *G01R 13/0272* (2013.01); *G06F 3/04847* (2013.01); *G06F 3/05* (2013.01); *G11B 20/00007* (2013.01)

(58) Field of Classification Search
CPC ..... H04L 43/04; H04L 43/024; H04L 43/045; H04L 43/02; G01R 13/0272; G06F 3/04847; G06F 3/05; G11B 20/00007

USPC ......................................................... 702/126
See application file for complete search history.

(56) References Cited

U.S. PATENT DOCUMENTS

2007/0217694 A1\* 9/2007 Sullivan ............. G01R 13/0272
                                                                    382/232
2012/0078557 A1    3/2012 Dobyns
2014/0257821 A1    9/2014 Adams et al.
(Continued)

FOREIGN PATENT DOCUMENTS

KR    1020080007041    1/2008

OTHER PUBLICATIONS

Korean Intellectual Property Office, International Search Report and Written Opinion for International Application PCT/US2020/063649, dated Mar. 31, 2021, 10 pages, Daejeon, Republic of Korea.

*Primary Examiner* — Michael P Nghiem
(74) *Attorney, Agent, or Firm* — Miller Nash LLP; Andrew J. Harrington

(57) ABSTRACT

A test and measurement instrument includes an acquisition memory and a processor structured to store a stream of sampled incoming data samples in the acquisition memory. As the memory fills, the instrument automatically decimates either the data samples already stored in the acquisition memory, the incoming data samples, or both. The instrument may also store two copies of the incoming data samples, one at an increased decimation rate. The two copies are tied together with a timestamp or using other methods. The more highly decimated copy may be used to produce a video output of the stored data samples, saving the instrument from generating the video output from the larger sized sample.

8 Claims, 9 Drawing Sheets

(56) References Cited

U.S. PATENT DOCUMENTS

2014/0324389 A1 10/2014 Baldwin et al.
2015/0097728 A1 4/2015 Chansarkar et al.

\* cited by examiner

FULL SAMPLE RATE — STATE 506A

| | A | B | C | D | E | F | G | H |
|---|---|---|---|---|---|---|---|---|
| 1 | 1 | 1 | 1 | 1 | 1 | 1 | 1 | 1 |
| 2 | 2 | 2 | 2 | 2 | 2 | 2 | 2 | 2 |
| 3 | 3 | 3 | 3 | 3 | 3 | 3 | 3 | 3 |
| 4 | 4 | 4 | 4 | 4 | 4 | 4 | 4 | 4 |
| 5 | 5 | 5 | 5 | 5 | 5 | 5 | 5 | 5 |
| 6 | 6 | 6 | 6 | 6 | 6 | 6 | 6 | 6 |
| 7 | 7 | 7 | 7 | 7 | 7 | 7 | 7 | 7 |
| 8 | 8 | 8 | 8 | 8 | 8 | 8 | 8 | 8 |

HALF SAMPLE RATE — STATE 506B

| | A | B | C | D | E | F | G | H |
|---|---|---|---|---|---|---|---|---|
| 1 | 1 | 1 | 1 | 1 | 1 | 1 | 1 | 1 |
| 2 | 9 | 9 | 9 | 9 | 9 | 9 | 9 | 9 |
| 3 | 3 | 3 | 3 | 3 | 3 | 3 | 3 | 3 |
| 4 | 11 | 11 | 11 | 11 | 11 | 11 | 11 | 11 |
| 5 | 5 | 5 | 5 | 5 | 5 | 5 | 5 | 5 |
| 6 | 13 | 13 | 13 | 13 | 13 | 13 | 13 | 13 |
| 7 | 7 | 7 | 7 | 7 | 7 | 7 | 7 | 7 |
| 8 | 15 | 15 | 15 | 15 | 15 | 15 | 15 | 15 |

QUARTER RATE — STATE 506C

| | A | B | C | D | E | F | G | H |
|---|---|---|---|---|---|---|---|---|
| 1 | 1 | 1 | 1 | 1 | 1 | 1 | 1 | 1 |
| 2 | 9 | 9 | 9 | 9 | 9 | 9 | 9 | 9 |
| 3 | 17 | 17 | 17 | 17 | 17 | 17 | 17 | 17 |
| 4 | 21 | 21 | 21 | 21 | 21 | 21 | 21 | 21 |
| 5 | 5 | 5 | 5 | 5 | 5 | 5 | 5 | 5 |
| 6 | 13 | 13 | 13 | 13 | 13 | 13 | 13 | 13 |
| 7 | 25 | 25 | 25 | 25 | 25 | 25 | 25 | 25 |
| 8 | 29 | 29 | 29 | 29 | 29 | 29 | 29 | 29 |

EIGHTH RATE — STATE 506D

| | A | B | C | D | E | F | G | H |
|---|---|---|---|---|---|---|---|---|
| 1 | 1 | 1 | 1 | 1 | 1 | 1 | 1 | 1 |
| 2 | 9 | 9 | 9 | 9 | 9 | 9 | 9 | 9 |
| 3 | 17 | 17 | 17 | 17 | 17 | 17 | 17 | 17 |
| 4 | 33 | 33 | 33 | 33 | 33 | 33 | 33 | 33 |
| 5 | 41 | 41 | 41 | 41 | 41 | 41 | 41 | 41 |
| 6 | 49 | 49 | 49 | 26 | 49 | 49 | 49 | 49 |
| 7 | 25 | 25 | 25 | 57 | 25 | 25 | 25 | 25 |
| 8 | 57 | 57 | 57 | 57 | 57 | 57 | 57 | 57 |

FIG. 5

STATE 606A — /FULL SAMPLE RATE

| | A | B | C | D | E | F | G | H |
|---|---|---|---|---|---|---|---|---|
| 1 | 1 | 1 | 1 | 1 | 1 | 1 | 1 | 1 |
| 2 | 2 | 2 | 2 | 2 | 2 | 2 | 2 | 2 |
| 3 | 3 | 3 | 3 | 3 | 3 | 3 | 3 | 3 |
| 4 | 4 | 4 | 4 | 4 | 4 | 4 | 4 | 4 |
| 5 | 5 | 5 | 5 | 5 | 5 | 5 | 5 | 5 |
| 6 | 6 | 6 | 6 | 6 | 6 | 6 | 6 | 6 |
| 7 | 7 | 7 | 7 | 7 | 7 | 7 | 7 | 7 |
| 8 | 8 | 8 | 8 | 8 | 8 | 8 | 8 | 8 |

STATE 606B — /FULL SAMPLE RATE / / HALF SAMPLE RATE /

| | A | B | C | D | E | F | G | H |
|---|---|---|---|---|---|---|---|---|
| 1 | 1 | 1 | 1 | 1 | 1 | 1 | 1 | 1 |
| 2 | 2 | 2 | 2 | 2 | 9 | 9 | 9 | 9 |
| 3 | 3 | 3 | 3 | 3 | 3 | 3 | 3 | 3 |
| 4 | 4 | 4 | 4 | 4 | 11 | 11 | 11 | 11 |
| 5 | 5 | 5 | 5 | 5 | 5 | 5 | 5 | 5 |
| 6 | 6 | 6 | 6 | 6 | 13 | 13 | 13 | 13 |
| 7 | 7 | 7 | 7 | 7 | 7 | 7 | 7 | 7 |
| 8 | 8 | 8 | 8 | 8 | 15 | 15 | 15 | 15 |

STATE 606C — /FULL RATE/ /HALF RATE/ / QUARTER RATE

| | A | B | C | D | E | F | G | H |
|---|---|---|---|---|---|---|---|---|
| 1 | 1 | 1 | 1 | 1 | 1 | 1 | 1 | 1 |
| 2 | 2 | 2 | 9 | 9 | 9 | 9 | 9 | 9 |
| 3 | 3 | 3 | 3 | 3 | 17 | 17 | 17 | 17 |
| 4 | 4 | 4 | 11 | 11 | 21 | 21 | 21 | 21 |
| 5 | 5 | 5 | 5 | 5 | 5 | 5 | 5 | 5 |
| 6 | 6 | 6 | 13 | 13 | 13 | 13 | 13 | 13 |
| 7 | 7 | 7 | 7 | 7 | 25 | 25 | 25 | 25 |
| 8 | 8 | 8 | 15 | 15 | 29 | 29 | 29 | 29 |

STATE 606D — /FULL RATE/ /HALF RATE/ /QUART. RTE./ /EIGHTH RATE/

| | A | B | C | D | E | F | G | H |
|---|---|---|---|---|---|---|---|---|
| 1 | 1 | 1 | 1 | 1 | 1 | 1 | 1 | 1 |
| 2 | 2 | 2 | 9 | 9 | 9 | 9 | 9 | 9 |
| 3 | 3 | 3 | 3 | 3 | 17 | 17 | 17 | 17 |
| 4 | 4 | 4 | 11 | 11 | 21 | 21 | 33 | 33 |
| 5 | 5 | 5 | 5 | 5 | 5 | 5 | 41 | 41 |
| 6 | 6 | 6 | 13 | 13 | 13 | 13 | 49 | 49 |
| 7 | 7 | 7 | 7 | 7 | 25 | 25 | 25 | 25 |
| 8 | 8 | 8 | 15 | 15 | 29 | 29 | 57 | 57 |

FIG. 6

|    | S1 | S2 | S3 | S4 | S5 | S6 | S7 | S8 | S9 | S10 | S11 |
|----|----|----|----|----|----|----|----|----|----|-----|-----|
| 1  | 1  | 1  | 1  | 1  | 1  | 1  | 1  | 1  | 1  | 1   | 1   |
| 2  | 2  | 33 | 33 | 33 | 33 | 33 | 1025 | 1025 | 1025 | 1025 | 1025 |
| 3  | 3  | 3  | 65 | 65 | 65 | 65 | 65 | 2049 | 2049 | 2049 | 2049 |
| 4  | 4  | 35 | 69 | 129 | 129 | 129 | 129 | 129 | 4097 | 4097 | 4097 |
| 5  | 5  | 5  | 5  | 137 | 257 | 257 | 257 | 257 | 257 | 8193 | 8193 |
| 6  | 6  | 37 | 37 | 145 | 145 | 513 | 513 | 513 | 513 | 513 | 16385 |
| 7  | 7  | 7  | 73 | 73 | 273 | 545 | 1089 | 2177 | 4353 | 8705 | 17409 |
| 8  | 8  | 39 | 77 | 153 | 289 | 289 | 1153 | 1153 | 4609 | 4609 | 18433 |
| 9  | 9  | 9  | 9  | 9  | 305 | 577 | 577 | 2305 | 2305 | 9217 | 9217 |
| 10 | 10 | 41 | 41 | 41 | 321 | 321 | 321 | 2433 | 4685 | 9729 | 19457 |
| 11 | 11 | 11 | 81 | 81 | 81 | 609 | 1217 | 2561 | 2561 | 2561 | 20481 |
| 12 | 12 | 43 | 85 | 161 | 161 | 161 | 1281 | 1281 | 1281 | 10241 | 10241 |
| 13 | 13 | 13 | 13 | 169 | 337 | 641 | 641 | 641 | 5121 | 5121 | 5121 |
| 14 | 14 | 45 | 45 | 177 | 177 | 673 | 1345 | 2689 | 5377 | 10753 | 21505 |
| 15 | 15 | 15 | 89 | 89 | 353 | 353 | 1409 | 1409 | 5633 | 5633 | 22529 |
| 16 | 16 | 47 | 93 | 185 | 369 | 705 | 705 | 2817 | 2817 | 11265 | 11265 |
| 17 | 17 | 17 | 17 | 17 | 17 | 737 | 1473 | 2945 | 5889 | 11777 | 23553 |
| 18 | 18 | 49 | 49 | 49 | 49 | 769 | 769 | 769 | 769 | 12289 | 12289 |
| 19 | 19 | 19 | 97 | 97 | 97 | 97 | 1537 | 1537 | 1537 | 1537 | 24577 |
| 20 | 20 | 51 | 101 | 193 | 193 | 193 | 193 | 3073 | 3073 | 3073 | 3073 |
| 21 | 21 | 21 | 21 | 201 | 385 | 385 | 385 | 385 | 6145 | 6145 | 6145 |
| 22 | 22 | 53 | 53 | 209 | 209 | 801 | 1601 | 3201 | 6401 | 12801 | 25601 |
| 23 | 23 | 23 | 105 | 105 | 401 | 833 | 833 | 3329 | 3329 | 13313 | 13313 |
| 24 | 24 | 55 | 109 | 217 | 417 | 417 | 1665 | 1665 | 6657 | 6657 | 26625 |
| 25 | 25 | 25 | 25 | 25 | 433 | 865 | 1729 | 3457 | 6913 | 13825 | 27649 |
| 26 | 26 | 57 | 57 | 57 | 449 | 449 | 449 | 3585 | 3585 | 3585 | 28673 |
| 27 | 27 | 27 | 113 | 113 | 113 | 897 | 897 | 897 | 7169 | 7169 | 7169 |
| 28 | 28 | 59 | 117 | 225 | 225 | 225 | 1793 | 1793 | 1793 | 14337 | 14337 |
| 29 | 29 | 29 | 29 | 233 | 465 | 929 | 1857 | 3713 | 7425 | 14849 | 29697 |
| 30 | 30 | 61 | 61 | 241 | 241 | 961 | 961 | 3841 | 3841 | 15361 | 15361 |
| 31 | 31 | 31 | 121 | 121 | 481 | 481 | 1921 | 1921 | 7681 | 7681 | 30721 |
| 32 | 32 | 63 | 125 | 249 | 497 | 993 | 1985 | 3969 | 7937 | 15873 | 31745 |

SYSTEM FOR CONTINUOUS RECORDING AND CONTROLLABLE PLAYBACK OF INPUT SIGNALS

PRIORITY

This disclosure claims benefit of U.S. Provisional Application No. 62/944,960, titled "Continuous Recording and Controllable Playback of Input Signals in a Test and Measurement Instrument", filed on Dec. 6, 2019, which is incorporated herein by reference in its entirety.

TECHNICAL FIELD

This disclosure relates to physical and virtual test and measurement instruments and related functions, and more particularly to technology for storing and viewing data acquired by such test and measurement instruments.

BACKGROUND

In a system where a test and measurement device, such as a digital oscilloscope, measures a signal of interest from a device under test (DUT), the data sample rate and amount of memory in the instrument dictate the total amount of input data able to be captured by the instrument.

Generally, the memory capacity of an instrument has been limited by the cost of the memory devices used, which have traditionally been a type of random access memory. Memory used for data capture must include a high enough data throughput rate, and/or use de-interleaving techniques, to keep up with the rate of incoming sampled data. Limited memory has meant that instrument users are limited to only being able to capture and view a relatively short temporal duration of a signal of interest, often less than one second before the memory is filled. Such users, therefore, use instrument triggers to capture data from only a small portion of an input signal surrounding a triggering event. In such methods, trigger conditions are set and, when one or more trigger conditions are met, the instrument stores data from a short time before the event to a short time after the event. The instrument is able to store data from a short time before the trigger event because the data is stored in one or more circular buffers that is continuously overwritten. Then, when the pre-determined trigger condition is met, the instrument copies data from the circular buffer, which includes input data from before the trigger condition was satisfied, and then also begins recording input signal data in memory after the trigger condition was satisfied, until the internal memory fills. Once the memory is full, the instrument has no way of recording additional input data until the memory is deleted. So, if two triggering conditions happen back-to-back, the data that caused second trigger condition may be missed because the instrument is full, and is unable to store the data that caused the second trigger condition to be satisfied. Thus, much of the incoming data to measurement instruments, and especially to high-frequency oscilloscopes, is 'invisible' to standard measurement instruments, and is neither measured nor stored.

Examples of the disclosure address these and other deficiencies of the prior art.

BRIEF DESCRIPTION OF THE DRAWINGS

Aspects, features and advantages of examples of the present disclosure will become apparent from the following description of examples in reference to the appended drawings in which:

FIG. 5 illustrates contents of an example memory in various memory states of a binary decimation system according to embodiments of the invention.

FIG. 6 illustrates contents of another example memory in various memory states of a binary decimation system according to embodiments of the invention.

FIG. 7 illustrates contents of another example memory in various memory states of a binary decimation system according to embodiments of the invention.

DESCRIPTION

Disclosed herein is a test and measurement instrument that stores incoming data for later measurement. In some embodiments the incoming data may be stored without decimation, and is stored at the highest sampled rate. In other embodiments, the already-stored data may be decimated as the memory continues to store additional incoming data. Unlike conventional instruments, the data may be stored without the need to configure the instrument before storing the incoming data.

Other embodiments include two separate decimators, where the incoming data is compressed in at least two different ways, for different purposes. For example, the main data may be stored with no or minimal compression, while a thumbnail decimator stores just enough compressed data to create a thumbnail image representation of the data that may be shown on a user screen. The thumbnail representation may be timestamped to connect it to the stored data. In some embodiments the thumbnail images may be stored as a video stream.

In some embodiments the user is able to scroll through the stored data using tools such as fast-forward, pause, and rewind, for example. The stored data may also be summarized for later use. Triggers may also be used to instruct the instrument which incoming data to record and which to ignore.

Figure 1:
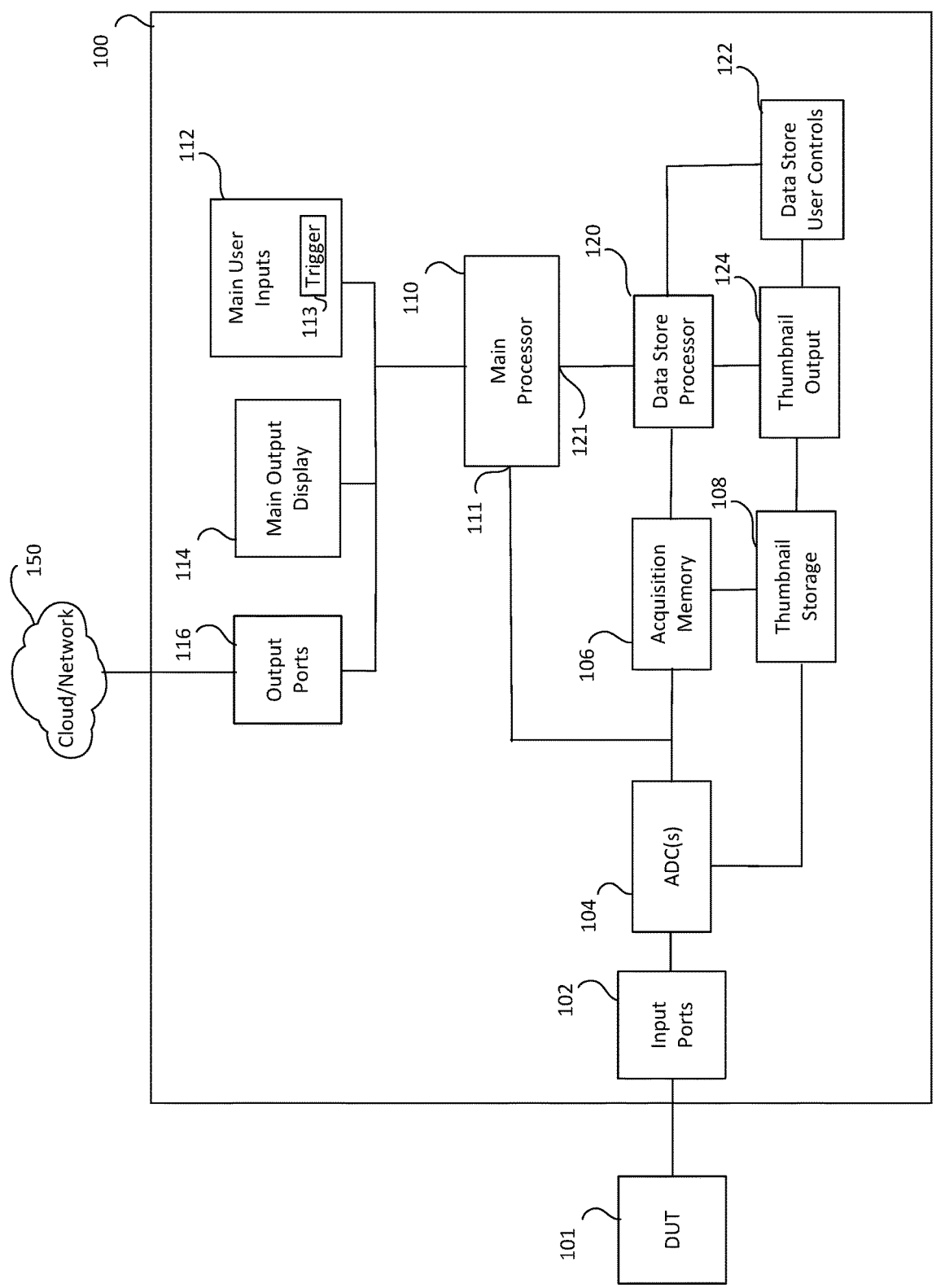
FIG. 1 is a block diagram of a test and measurement instrument according to examples of the disclosure.

FIG. 1 is an example block diagram of a test and measurement instrument 100 having features including continuous recording and controllable playback of input signals according to some configurations of the disclosure. The test and measurement instrument 100 includes one or more ports 102 which may be any electrical or optical signaling medium. Ports 102 may include receivers, transmitters, and/or transceivers. Each port 102 is a channel of the test and measurement instrument 100. In some embodiments the test and measurement instrument 100 includes 8, 16, or more separate ports. The test and measurement instrument 100 may couple to a Device Under Test (DUT) 101 through one or more ports 102.

The input signals received at the ports 102 are then sent to one or more analog-to-digital converters (ADCs) 104. The one or more ADCs 104 convert an analog signal received through the one or more ports 102 to a digital signal. If the input signal happens to be already in digital form, the ADCs 104 may be bypassed. The ADCs 104 have a sampling rate that is sufficient to sample the input signals with enough resolution to be usable by the instrument 100, and may be a 12-bit or higher resolution ADC 104. The ADCs 104 may operate at a speed high enough to sample 1 Billion samples/second. The ADCs 104 may operate in an interleaved manner if required. The digitized signal output from the one or more ADCs 104 are stored in an acquisition memory 106. As mentioned above, there may be one ADC 104 that samples incoming data at a much lower rate for the purpose of creating a thumbnail image of the incoming data, which may be stored separately from the main incoming data. For example, the main incoming data, after it is digitized by an ADC 104 is stored in the main acquisition memory 106, while the lower resolution data digitized by another ADC 104, or decimated by a data store processor 120, is stored in a thumbnail data storage 108. In practice, it is possible that the thumbnail data storage 108 be a portion of the main memory 106 set aside to store the thumbnail data.

The acquisition memory 106 may be a relatively large, solid state memory that is structured to store large amounts of incoming data, as described in detail below. The acquisition memory 106 may be implemented as solid state memory, such as a solid state disk drive(s). The acquisition memory 106 may be formed of Non-Volatile RAM (NVRAM). Other memory within the test and measurement instrument 100 may be implemented as processor cache, random access memory (RAM), read only memory (ROM), solid state memory, hard disk drive(s), or any other memory type. Memory acts as a medium for storing data, computer program products, and other instructions. Embodiments of the invention are operable in the acquisition memory 106, and may be operable in other of the various memories within the instrument 100, or with data stored in a remote network or cloud 150, as described further below.

In particular embodiments, the acquisition memory 106 may include 1 TB or more of memory having a 1 GB/s throughput rate. At such rates and capacities a user may store 1000 seconds of incoming data in the acquisition memory 106. With compression, even more data could be stored. Further, if the acquisition memory 106 were made from a 100 TB disk drive, or multiples of such drives, it may be possible for a user to store up to 24 hours of incoming data.

One or more main processors 110 may be configured to execute instructions from memory and may perform any methods and/or associated steps indicated by such instructions, such as receiving the acquired signals from the acquisition memory 106 and reconstructing the signal under test without the use of a hardware trigger or acquiring the sample in a single acquisition.

Main user inputs 112 are coupled to the one or more processors 110. Main user inputs 112 may include a keyboard, mouse, trackball, touchscreen, and/or any other controls employable by a user to interact with a GUI on a main output display 114. The display 114 may be a digital screen such as an LCD, or any other monitor to display waveforms, measurements, and other data to a user. In some embodiments the main output display 114 is located remote from the instrument 100.

Some embodiments may include a data store processor 120 that is separate from the main processor 100. The data store processor 120 may control operations specific to managing data stored in the acquisition memory 106, as described in detail below. In yet other embodiments such operations for managing data stored within the acquisition memory 106 are handled by the main processor 110.

Additionally, some embodiments may include data store user controls 122 that allow the user to control operations related to the input data stored in the acquisition memory. These operations are described in detail below. Further, some embodiments may include a thumbnail output 124, such as an output screen that shows a thumbnail representation of data stored in the acquisition memory 106. This thumbnail output 124 may operate separately from or in conjunction with main output display 114. In yet other embodiments the user operations from the user controls 122 may cause particular output to be displayed on the thumbnail output 124.

While the components of the test and measurement instrument 100 are depicted as being integrated within test and measurement instrument 100, it will be appreciated by a person of ordinary skill in the art that any of these components can be external to the test and measurement instrument 100 and can be coupled to the test and measurement instrument 100 in any conventional manner (e.g., wired and/or wireless communication media and/or mechanisms). For example, in some examples, the main display 114 or thumbnail output 124 may be remote from the test and measurement instrument 100. In some embodiments a remote computer may connect to the instrument 100 and cause the main display 114 to be shown on the display of the remote computer.

Referring back to Acquisition Memory 106, embodiments of the invention may be configured to provide essentially "endless" recording of input signals. In a conventional instrument, a sample rate of the input signal is either pre-determined by the instrument or chosen by the user before the input signal is acquired. Then, as the input signal is acquired from the DUT, the ADCs 104 sample the input signal to convert the input signal to a digital signal sampled at the desired sample rate and stores the samples in the acquisition memory 106. Although this disclosure describes the instrument as sampling an individual signal, recall that the instrument 100 samples at least an input signal for each port 102, and there may be multiple ports on an instrument. In a conventional instrument, once the acquisition memory is full—that is, when all of the memory locations have been written with data sampled at the pre-determined rate, one of two processes occur. First, the oldest data may be overwritten, so that the latest data is being continuously stored in the processor at the set rate. Or, the conventional instrument may stop recording any additional data after the acquisition memory is full.

Embodiments of the invention instead provide for a new paradigm in data storage for a test and measurement instrument or system. Instruments according to some embodiments provide for essentially "endless" recording of input signals into the acquisition memory 106. In a first instance, embodiments of the invention could initially operate as a conventional instrument by first storing the acquired data into the acquisition memory at the highest sampling rate. This operation provides the user the highest quality signal representation for later processing. In other words, if the acquisition memory 106 stores the incoming signal at the highest sample rate, the instrument is later able to faithfully recreate the input signal by referencing a copy of the digital approximation of the input signal that was stored in the acquisition memory. The ADCs 104 may sample the incoming data at up to 5× sampling, for example.

Once the acquisition memory 106 is full, and differently from conventional instruments, the measurement instrument 100 according to embodiments of the invention may continue recording data and storing it in the acquisition memory 106 by using various techniques as described in detail below.

Figure 2:
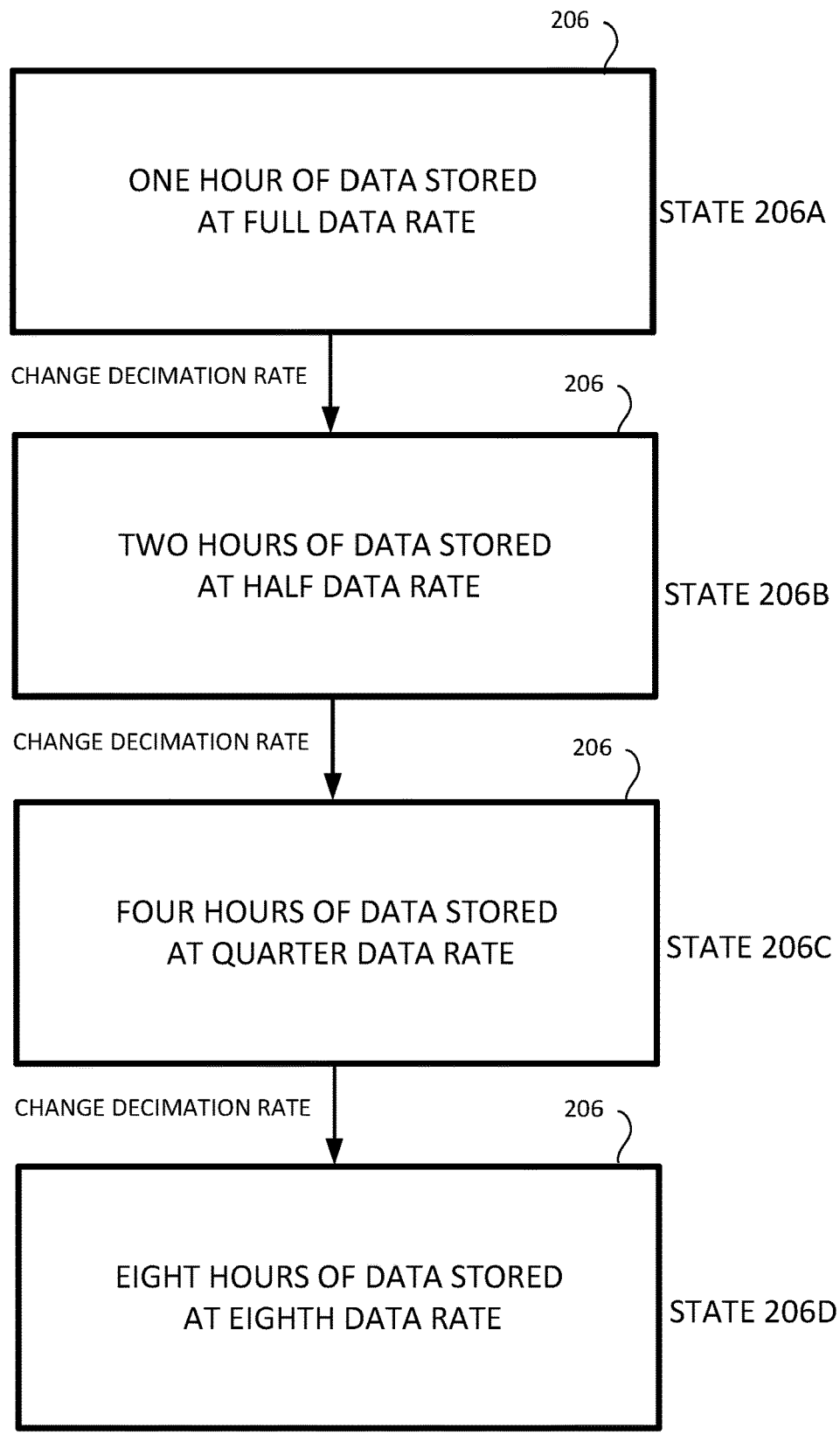
FIG. 2 is a memory state diagram that illustrates a first example of an automatic increase in signal storage capacity of the acquisition memory by operations of a data store processor configured to modify a decimation rate of both the incoming data as well as the previously stored data, according to embodiments of the invention.

FIG. 2 illustrates operations of the data store processor 120 to cause a data store memory to store varying amounts of data. Memory 206 may be an example of the acquisition memory 106 of FIG. 1. The example according to FIG. 2 illustrates how embodiments of the invention seamlessly store input data at adaptive decimation rates according to how full the memory is. In FIG. 2 the memory 206 is shown in four different states, as 206A, 206B, 206C, and 206D. As described above, first the instrument 100 stores input data acquired from the DUT at the full rate of, for example 1 billion samples of the waveform per second. Of course, data stored at such a high rate fills even large memories relatively quickly. Assume that the memory 206 is sized to store one hour of data at the full data rate. After one hour, a conventional instrument would begin overwriting the oldest data in its data store memory. Embodiments of the invention, however, allow the instrument 100 to store additional data into the acquisition memory 206 without intervention from the operator. In such embodiments, after the memory 206 in state 206A is full, the instrument 100 modifies how further data is stored in the acquisition memory 206. Next, the instrument 100, for example, through the data store processor 120, adapts the decimation rate for the new data being stored. The rates of decimation may change based on remaining memory capacity in the memory 206. As illustrated in FIG. 2, the data store processor 120 may choose to change the decimation rate and store the newly incoming data (i.e. the $2^{nd}$ hour, presently being stored) at a one-half rate, while simultaneously overwriting only a portion of the oldest stored data (i.e., the $1^{st}$ hour of data, previously stored). The end result is that two hours of half rate data are stored in the memory 206 at the end of state 206B.

While data is being stored in state 206B, the decimation rate of the storage of the incoming signal is doubled, so that data rate is halved. Then, as the memory 206 is filling, during state 206B, all of the even memory locations, which previously stored a portion of the first hour of data at the full rate, could be written over with the second hour of data that is being stored at one-half the data rate. At the end of the state 206B, the even memory locations would store the latest-recorded input signal, the second hour of data, at one-half data rate, while the odd memory locations would store the oldest recorded input signal, the first hour of data, at one half the data rate. Either the even or odd locations could be chosen for either the oldest or the newest signals; such a selection is an implementation detail. Note how the first hour of stored data in the memory at the end of the state 206A changes to half-rate data by the end of state 206B. This occurs because the data store processor 120 causes half of the full-rate data from state 206A to be overwritten by the new half-rate data of the second hour data being stored. In other words, the data stored at the end of state 206A is not lost, it just loses some fidelity, or precision, from having its data rate halved by being partially overwritten. If the original signal were sampled at a high enough frequency, such as by over sampling, halving the data rate should still allow the input signal to be recreated and used in the instrument 100 without significant losses.

After the memory 206 is filled with two-hours of data stored at one-half data rate, as represented by state 206B, embodiments of the invention may progress to a memory state 206C, where the incoming data rate is decimated by 4, which would allow four hours of data to be stored at a quarter data rate. In practice, the data store processor 120 of FIG. 1, to fill the memory 206 from state 206B to memory state 206C, the cycle described above with reference to state 206B can repeat itself, where every other memory location of both the even and the odd memory values may be over written by the incoming input data that is also decimated by a factor of 4 (i.e., one-quarter rate) before being stored in the memory 206. Finally, the process may continue to memory state 206D, where eight hours of data are stored in the memory 206, and all eight hours are stored at one-eighth data rate, i.e, a decimation factor of 8. Note that the instrument 100 is not limited to these examples, and the decimation may continue. The memory 206 could store sixteen hours of data stored with a decimation factor of 16, or thirty-two hours of data stored with a decimation factor of 32. Conceivably, this decimation could continue in perpetuity. At some point, the decimation will be so severe that the original input signal cannot be derived from the stored, overly decimated signal. This state, however, will depend on various factors such as original signal frequency, sampling frequency, sampling depth, and amount of storage. In some embodiments, a limit of decimation may be set, where no data is stored in the memory 206 above a certain decimation level, such as when the decimation level would result in a data rate less than the Nyquist rate for the original input signal. In this embodiment, the oldest data may be deleted as new data is stored, so that the memory 206 always stores data that is usable by the operator of the instrument 100.

Embodiments of the invention may be configured to automatically cause the instrument 100 to step through the various stages as illustrated in FIG. 2, and beyond, so that the operator need not set up the instrument to particular decimation rates and times beforehand. In other words, the instrument 100 may be configured to automatically modify its storage, using one of the methods described above or below, to automatically increase a data decimation rate of either the data being newly stored, or the data already stored, or both, to expand the amount of time input signals are stored in the acquisition memory 106.

Although the above method of automatic decimation is one way to automatically increase the "depth" of storage, i.e., the amount of time that an original input signal will be stored, there are other methods of storing data in an acquisition memory with increasing levels of decimation.

As another example, in other embodiments, a high resolution, low pass filter decimation mode may be used. Using this decimation operation, the instrument 100 would modify its sampling rate to increasingly go to higher resolution and go to lower bandwidth as the sample rate slows down, to avoid aliasing. This may also be controlled by the data store processor 120 in conjunction with the ADCs 104. Such a process of increasing resolution and lowering bandwidth would also naturally evolve the operating mode of the instrument 100 effectively from an oscilloscope digitizer to a high-resolution DC data logger, without having to set that up ahead of time.

The example with respect to FIG. 2 treated all of the memory 206 in the same manner. Meaning, during state 206A all of the data is being stored in the memory 206 at the full rate, in state 206B all of the data is being stored in the memory 206 at the half rate, etc. Other embodiments of the invention may effectively partition the memory so that the newest incoming data is being stored at the full rate while older data is automatically decimated. Examples of such a system are described with reference to FIG. 3.

Figure 3:
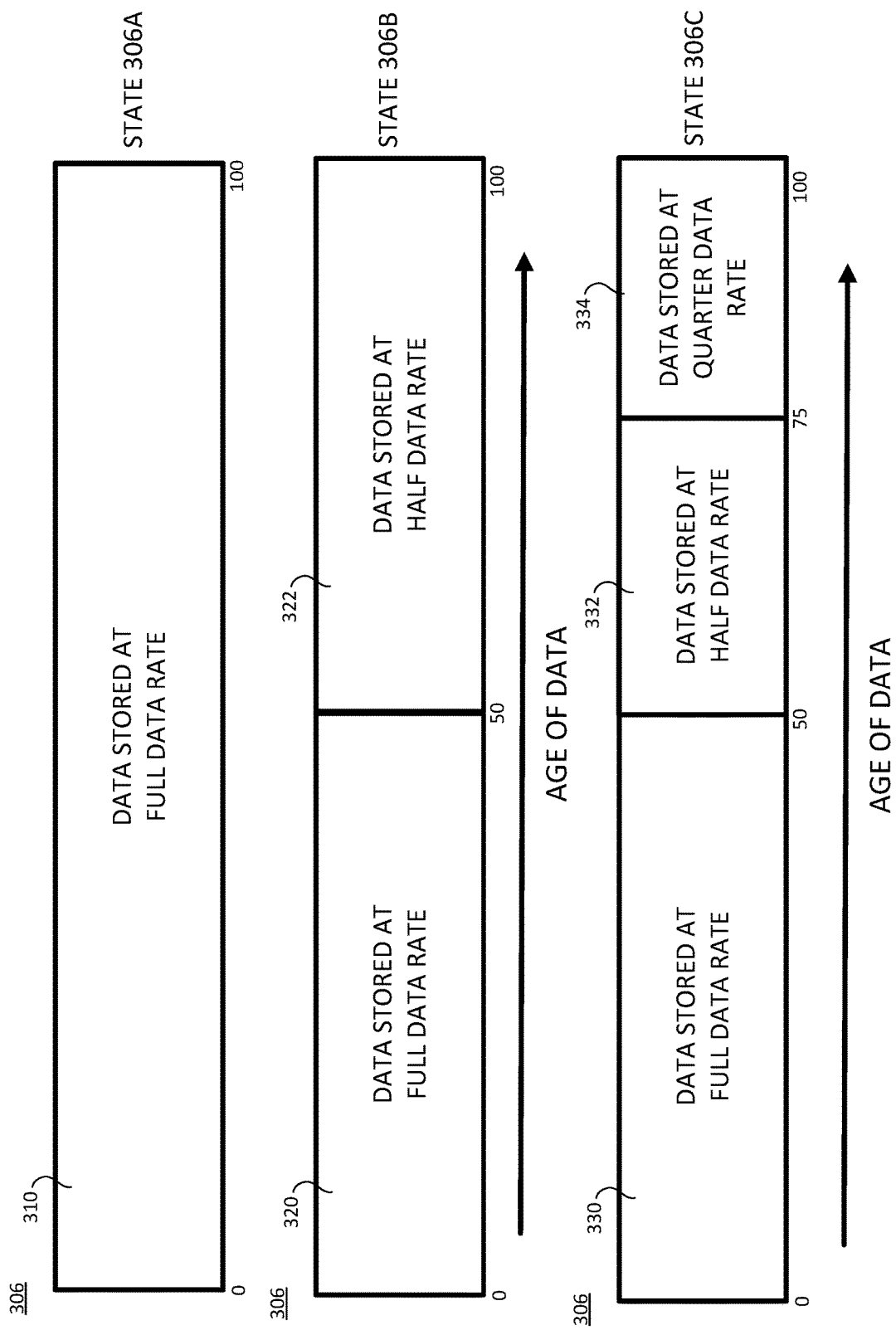
FIG. 3 is a memory state diagram that illustrates a second example of an automatic increase in signal storage capacity of the acquisition memory by operations of a data store processor configured to modify a decimation rate of both the incoming data as well as the previously stored data, according to embodiments of the invention.

In the embodiment illustrated in FIG. 3, memory 306 may be an example of the acquisition memory 106 of FIG. 1. Similar to the embodiment described with reference to FIG. 2, the embodiment of FIG. 3 includes a memory 306 shown in various states. In state 306A, the entirety 310 of memory 306 is filling at the full data rate, similar to state 206A of FIG. 2. After the memory 306 is full at the end of state 306A, the memory 306 is internally partitioned. In the illustrated example, 50% of the memory 306 in state 306B is allocated to continue to have data stored in its portion at the full data rate. This is illustrated as memory portion 320. Next, the remaining portion 322 of memory 306 in state 306B is allocated to have its data decimated by 2, i.e., having data stored at half the data rate. In this sense, the memory portion 322 is filled as above with reference to state 206B, where half of the data that was originally stored in the memory portion 322 is overwritten by the newly acquired data. But, differently to state 206B, in state 306B, 50% of the memory 306 is allocated to storing data at the full rate. During state 306B, the memory 306 may be decimated as new data comes in. In other words, at the beginning of state 306B, the entire memory is full of data stored at the full data rate. Then, as the next incoming signal is acquired and digitized, either the odd or even memory locations of the oldest signal in the memory 306 is overwritten by the next-to-oldest signal in the memory 306. In this way, the portion 322 effectively starts out as a single column wide, while the portion 320 of the memory 306 makes up nearly the entirety of the memory 306. Then, as state 306B progresses, the portion 322 that has data stored at the half data rate expands while the portion 320 shrinks, as more and more of the memory 306 is being decimated by 2. Finally, state 306B ends when 50% of the memory of 306 is allocated to portion 320 and 50% is allocated to portion 322. At the end of state 306B, the portion 322 is full with input data that is decimated by two, and the portion 320 is full with data that has been stored at the full data rate.

The decimation-in-place process can continue as illustrated in FIG. 3 by state 306C, where 50% of the portion 322 has been allocated to portion 334, which, in state 306C, will be filled with data stored at a decimation factor of 4, i.e., quarter data rate data. The memory 306 in state 306C is filled in the same way as the memory state 306B, with the oldest data being decimated first, but with a higher decimation rate. In state 306C, the oldest data from portion 322 is again decimated by two, yielding data decimated by four, and stored in portion 334. Data from the oldest portion of portion 330 is simultaneously decimated by two, and stored in the portion 332. Such decimation continues until the end of state 306C, where portion 330 of the memory 306 is full of full data rate data, portion 332 is full of half-rate data, and portion 334 is full of quarter rate data. As before, the instrument 100 may continue dividing portions of the memory 306 for further decimation, automatically, as additional data is input to the instrument 100.

It is important to note that the decimation illustrated in FIG. 3 is not limited to any particular sized portions of the memory 306. In other words, at the end of state 306B, the memory 306 has 50% its data stored at the full data rate, portion 320, and 50% of its data stored at the half data rate, portion 322. In some embodiments the 50% number is controllable, and the user can determine how much data of the various amounts of decimation may be stored. In other embodiments the manufacturer of the instrument 100 predetermines how the memory will be allocated as it is being decimated, and the decimation occurs automatically as the memory 306 fills.

Figure 4:
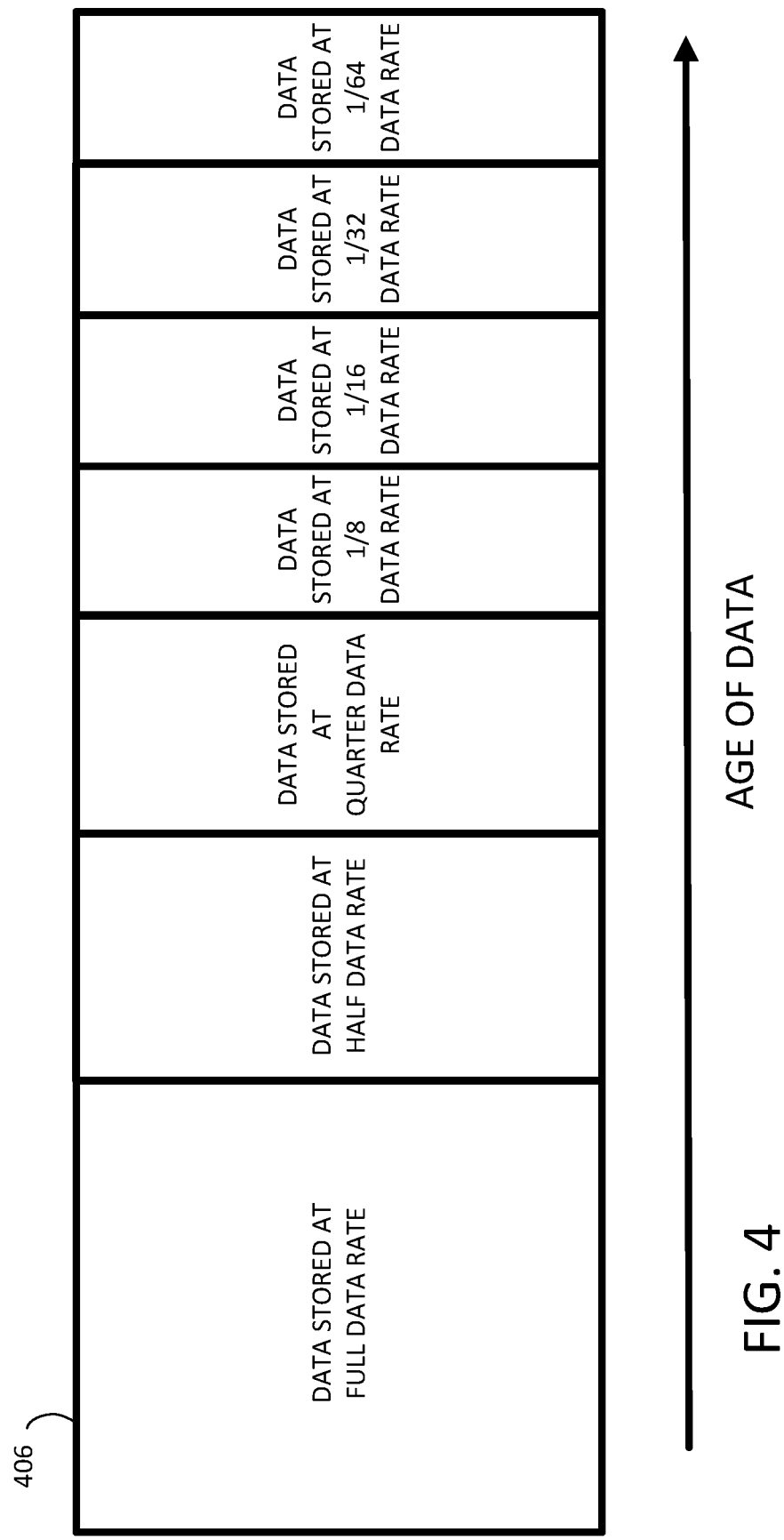
FIG. 4 is a memory diagram that illustrates that the acquisition memory of a test and measurement instrument may be portioned to any size sub-portions, according to embodiments of the invention.

FIG. 4 illustrates an example memory 406 that has data stored at a variety of different data rates, i.e., at a variety of different decimation rates. FIG. 4 further illustrates that the sizes of the portions of the different data rates may be divided in any relative size. In other words, unlike the memory 306 illustrated in FIG. 3, where the entire memory was divided at each state in a binary ½' progression (½, ¼ etc.,) it is not necessary that the various portions of acquisition memory 106 have any particular set size. In some embodiments the sizes of the various portions of memory are predetermined by the manufacturer by programming the specific operation of the data store processor 120. In other embodiments the relative sizes of the portions of memory that contain different decimation rates may be controllable or selectable by the user. Further, the various relative sizes may be different based on the particular function of the instrument 100, and the user may be able to store memory portion size preferences associated with various functions of the instrument. In some embodiments the number of columns is the same for each of the decimation sizes being used by the memory 106. In some embodiments the instrument 100 may use one or more portioning and automatic decimation method for one channel or input signal, and use a different memory portioning and automatic decimation method for a different channel or input signal.

FIG. 5 illustrates example contents of an acquisition memory 506 as it is being decimated in various states. Due to the flexibility of implementing embodiments of the invention in a variety of ways, many memory filling schemes are described as alternative examples. In FIG. 5, state 506A illustrates an acquisition memory 506 accepting samples at the full sample rate. Consider each column as representing a separate input signal, A-H, for a total of eight signals being sampled. Each column could be a signal from a different port 102 (FIG. 1). In other words, in this configuration, each column A-H could be a separate channel for input channels 1-8 of an oscilloscope or other data collecting device.

State 506A represents a state where all of the samples are being stored at the full data rate. These samples are stored in eight memory locations for each column, labeled 1-8. Note that what is represented in FIG. 5 is the time the sample was sampled, 1, 2, 3, 4, etc., and not the value of the sample at that particular time.

After the memory 506 fills at the end of state 506A, the instrument 100, though the data store processor 120 or other processor, determines that all of the data stored in memory 506 will be decimated in place, and at the same rate of decimation throughout the memory 506, similar to the example described with reference to FIG. 2 above. In other embodiments, as described above with reference to FIGS. 3 and 4, not all of the acquisition memory need be decimated at the same rate, and examples of this variation are described with reference to FIG. 6 below.

With reference to FIG. 5, after the memory 506 fills at the end of state 506A, the data store processor 120 determines that the memory 506 will be filled at a higher decimation rate, such as a decimation rate of 2, which means samples are stored at half-rate compared to the full rate. To enable the decimation in place, first, one-half of the memory 506, in this case the even memory rows, are marked available to be overwritten in state 506B, which frees up one-half of the memory 506. This means rows 2, 4, 6, and 8 are available to store new data. Of course, in other embodiments the odd rows or other memory locations could have been marked as available to be overwritten. Next, the next sample for each signal is stored in the first available memory location. For example, for the signal being sampled and stored in Column A, first A2, A4, A6, and A8 are marked as available. Then, A2 is filled with the sample at time 9, A4 is filled with time sample 11, A6 is filled with time sample 13, and A8 is filled with time sample 15. At the end of state 506B, Column A contains a series of samples that represent every other time sample from 1-15, which together make a half-sample rate representation for the signal used for Column A. In other words, the signal that was sampled to create Column A has been decimated-by-two without losing the first four samples (A1, A3, A5, A7) from when the signal was sampled at its full rate in state 506A. This action of preserving these first set of samples is why this processes has been referred to as decimation-in-place, because the first four samples of a half-rate sampled signal were already present in memory 506, having been placed there during the state 506A, while the second four samples of the half-rate sampled signal were added later, during state 506B. This allowed the instrument 100 to accept data at the highest rate possible until the memory 506 filled, then changed to an increased decimation rate to store additional data (i.e., the samples of the signal that occurred later in time) without losing all of the data stored at the previous data collection rate, when the instrument was storing data at a higher rate.

At the end of state 506B, the memory 506 contains eight sampled signals respectively located in Columns A-H, each sampled at half-rate. The change from the end of state 506A to the end of state 506B has been a decimate-by-two change.

Once the memory is filled at the end of state 506B, this process can continue by decimating the data stored at the end of state 506B once again, to quarter-rate data, which occurs during State 506C.

With reference to state 506C, the process described above repeats, although there are subtle differences. With reference again to Column A, first the system, such as through the data store processor 120 (FIG. 1), marks the memory locations not needed to store the sampled signal at the current decimation rate. In this case, in state 506C, the instrument 100 is storing data at one-quarter of the full-sampled signal. Therefore, locations A3, A4, A7, and A8 are marked as being available for storing new, i.e., the later times samples, for the signal sampled for Column A. One way to determine which locations to mark as available for the current decimation rate is to mark only those locations that store data that will be used in the present decimation rate. With reference to state 506C in FIG. 5, for a quarter-rate sampled signal, i.e., decimated by four, the times that create such a quarter rate sample are the Set QRS (Quarter-Rate-Set) [1, 5, 9, 13, 17, 21, 25, 29]. By inspection, Set QRS contains every fourth time sample of the signal being used to populate the particular columns. Next, the system can determine the locations in State 506B that contain any of these samples in Set QRS are found in A1, A2, A5, and A6. Thus, the other locations at the end of State 506B, i.e. A3, A4, A7, and A8 may be marked as being available to store the new, i.e., later sampled data.

At the beginning of State 506C, four locations in Column A have been marked as available, A3, A4, A7, and A8. The State 506B ended at time 15, as represented in position A8 of State 506B. The next time signal after 15 in the Set QRS is the sample at time 17, which is stored in position A3 of State 506C, where the signal for Column A is being stored at quarter rate. The next time signal in Set QRS is the sample at time 21, which is stored in the next available position, which is A4. The next time signal in Set QRS is the sample at time 25, which is stored at position A7, and the final time signal in Set QRS to be stored in State 506C is 29, which is stored in position A8. After all of the samples for time 29 have been stored in each of the Columns A-H, the memory 506 is full again, at the end of State 506C.

A further decimation may be performed at the end of State 506C to store all of the samples making up eighth-rate data. For State 506D, at the decimation rate of 8, samples for rows 4, 5, 6, and 8 are marked as available to be overwritten, as these rows contain data from Set QRS that is not contained in the set of data for decimate by 8, Set ERS (Eighth-Rate-Set) [1, 9, 17, 25, 33, 41, 49, 57]. Therefore, in this example, A4 is updated to new time sample 33, A5 is updated to new time sample 41, A6 is updated to new time sample 49, and A8 is updated to new time sample 57. At the end of State 506D, the memory 506 contains eight, eighth-rate samples for the columns A-H.

Using embodiments of the invention, by stepping through the States 506A-506D, the system stored samples at the highest decimation rate possible until the memory 506 filled, and then automatically increased the decimation rate to "create" more room in the memory 506. Although it is true that a user could have set the instrument 100 to decimate-by-eight originally, and end up at the state 506D, embodiments of the invention allow the system to automatically determine the best decimation rate at which to store data in the acquisition memory 106 to maximize the optimum decimation level for the memory size. And, embodiments of the invention maximize the optimum decimation rate automatically, without intervention from the user.

Further, with reference to FIG. 6, embodiments of the invention may allow the user to control which portions of memory may be used for automatic decimation. In other words, it is not necessary to decimate the entire memory at the same rate.

FIG. 6 illustrates an example of filling memory 606 in which various portions of memory 606 are reserved to not be decimated, or decimated at a different rate than other portions.

State 606A is identical to State 506A, where eight signals are sampled, one each for Columns A-H, at the full sample rate. At the end of State 606AB, the memory 606 is full. Next the system determines to decimate the memory 606, except only one-half of the memory 606 is decimated in State 606B. For state 606B, either the user could have indicated that only one-half the memory 606 is to be decimated, or the instrument 100 could be pre-programmed or pre-set to decimate only a portion of the memory 606. In some embodiments the level of decimation or amount of memory 606 to be decimated are user configurable.

In State 606B, Columns E-H are identical to Columns E-H of State 506B, while Columns A-D are the same as State 506A, as those columns of memory 606 are not being decimated. Instead, Columns A-D of memory 606 in State 606B contain the original, full-rate samples of times 1-8. Essentially, in this state 606B, the instrument 100 has been configured to mark Columns A-D of memory 606 as full, and not accept any more incoming data in those columns. In other embodiments, not pictured, the Columns A-D of State 606B could instead include samples from times 9-15, which would be an embodiment of the oldest data being overwritten, rather than being retained.

In State 606C, the system determined to maintain Columns A and B as full-rate data, to decimate Columns E-H into quarter-rate data, and to retain two columns of the half-sample rate data. In other words, between States 606B and 606C, Columns A and B are unchanged, since they were marked as full. Columns E-H are decimated to quarter rate data, using techniques described above between states 506B and 506C of FIG. 5. The Columns C and D are treated in a different manner than described before. These columns are overwritten between States 606B to 606C to make a copy of some of the half-sampled rate data of State 606B. For example, in State 606C, the data from Columns E and F from State 606B may be copied into Columns C and D of State 606C. This has the effect of preserving some of the half-sample rate data (Columns E and F, for example, of State 606B) at the expense of losing some of the full sample rate data (Columns C and D of State 606B).

State 606D continues the progression. At the end of State 606D, Columns A and B include the oldest data of the full sample rate, Columns C and D include the oldest data of the half sample rate, Columns E and F include the oldest data of the quarter sample rate, and Columns G and H include all of the data of the eighth sample rate. Of course, instead of retaining the oldest data, as described above, instead these columns could overwrite the latest data so only the latest data, at each sample rate, is preserved.

As shown above, embodiments of the invention may be implemented in a wide variety of variations depending on the needs of the system.

FIG. 7 illustrates an example of samples from a single signal being decimated a number of times in a memory 706 having 32 sample storing locations. Different than the above examples, memory 706 includes only 32 memory locations for storing individual samples, labeled 1-32. The example with reference to FIG. 7 illustrates memory contents of the memory 706 at various states to illustrate a deeper decimation of samples compared to the prior examples. In this example, the Columns S1, S2, S3, etc., illustrate the various states State 1, State 2, State 3 etc. of the different states of decimation of a memory 706, which may be an example of an acquisition memory 106 of FIG. 1.

In state 1, represented by Column S1, the samples are being stored at the full data rate, with the first samples at times 1-32 respectively stored in locations 1-32 of the memory 706. In Column S2, the samples are decimated-in-place to a decimation rate of 2, using the techniques described above. At the end of State S2, the signal has been decimated by 2, with ever every other sample of the original samples 1-32 of State S1 retained, while also adding every other samples sample of times 33-64.

Column S3 represents the state of the memory 706 when the incoming samples have been decimated by a factor of 4. Careful inspection of Column S3 verifies that it includes every fourth sample of the signal from times 1-128. Also, note that if it took one hour to fill Column S1, it took another hour to fill Column S2, for a total of two hours. Further, it took two hours to fill Column S3, for a total of four hours of data storage in the memory 706.

Continuing through the columns, S4, S5, and S6 show the sample being decimated at rates of 8, 16, and 32, respectively. S7 includes samples of the original input signal decimated at a rate of 64. In this example of FIG. 7, this binary progression continues until the memory 706 at the end of State 11, illustrated in the Column S11, has been decimated by a factor of 1024. Note that, at the rate of 32 samples per hour, as set above, it would take over 1000 hours to progress through the memory states S1-S11 illustrated in the example of FIG. 7.

It is important to note that the full sampling rate of any of the above-described input signals may be set according to the frequency of the signal, as is well known in signal sampling techniques. Thus, the full sample rate of a WiFi signal, operating in the GHz range may have a much higher full sampling rate, i.e., sampling frequency, than a 60 Hz Alternating Current (AC) signal, such as is provided in household circuits. Such sampling rates may be set by setting the rates of the ADCs 104. Additionally, the decimation rate may be controlled by the data store processor 120, by eliminating particular of the samples generated by the 104, i.e., the samples that have been determined to not be needed given the present rate of decimation in the instrument 100, or in the various sections of the acquisition memory 106.

As described above, in some embodiments of the invention, each subsequent decimation ratio increase by $2^n$, where n is the number of decimation levels. For example, the decimation ratio may progress from 1, 2, 4, 8, 16, yielding samples at full, half, quarter, eighth, and sixteenth sample rates. Of course, different decimation rates may be used for subsequent levels other than a binary exponential progression. In some embodiments the progression could be linear, as in 2n, 3n, or 4n, depending on the instrument mode, or the planned instrument use. In other embodiments a peak-detect decimation process may be used, where the decimation rate is set according to peaks detected by the instrument or set by the user. Some instruments made by Tektronix, Inc. of Beaverton, Oreg. include an acquisition mode known as FASTACQ acquisition mode in which the instrument captures as many waveforms per second as possible, e.g. greater than 400,000 waveforms/second. A user may use the FASTACQ acquisition mode, or a similar process to catch very infrequent glitches, i.e., times where the input signal exceeds a pre-set trigger level, or other events in a signal. In some embodiments of the disclosure using a peak detect decimation algorithm, if the type of data glitches caught by triggers the user is looking for with the FASTACQ acquisition mode were to happen, they could still catch them even in a low sample rate.

Figure 8:
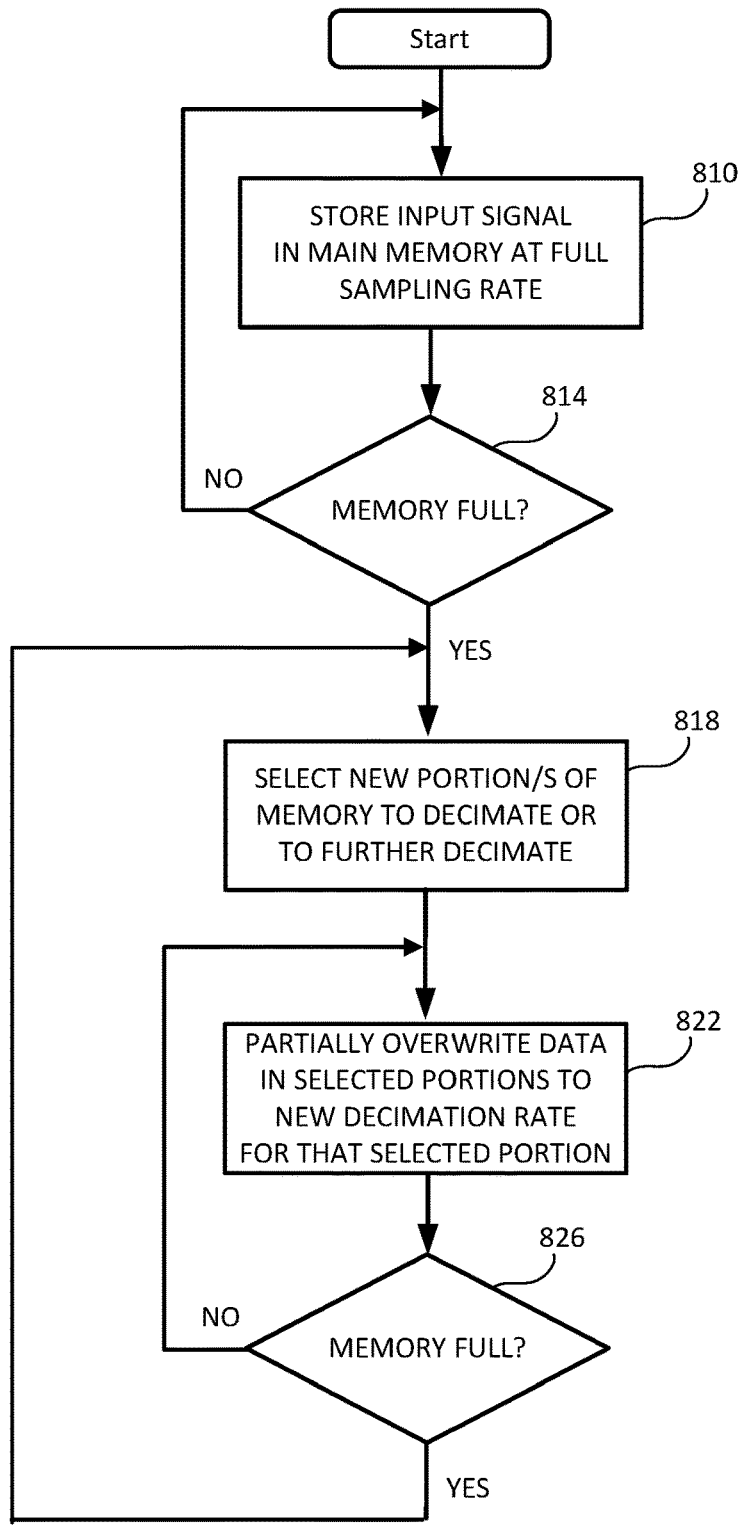
FIG. 8 is a flow chart illustrating example operations used by a continuously recording test and measurement device according to embodiments of the invention.

FIG. 8 is a flow chart illustrating example operations used by a continuously recording test and measurement device according to embodiments of the invention. A flow 800 begins with an operation 810 where incoming data, such as a data record of an input signal is stored in a memory, such as the acquisition memory 106 of the instrument 100 illustrated in FIG. 1. As described above, a digitized input signal may be stored in operation 810 at a full sampling rate. In other embodiments the digitized input signal need not be stored at the maximum sampling rate, but at any rate. An operation 814 checks to see if memory is full. The memory need not be absolutely full for the operation 814 to exit in the YES direction, but rather the test is whether memory is above a threshold amount of full. If the memory is not full, operation 814 exits in the NO direction and data continues to be stored at the same rate as it was previously.

Once the memory is full, or above the 'full' threshold, the operation 814 exits in the YES direction. Then, in an operation 818, the instrument 100 determines which portions of the acquisition memory are to be decimated to make room for the still-incoming data. In the embodiment described with reference to FIG. 2, the entire acquisition memory is set for decimation. In the embodiment described with reference to FIGS. 3, 4, and 5, portions of the acquisition memory are set for decimation, while other portions are reserved for full-rate acquisition.

Next, in an operation 822, elements of the data record already stored in the memory portions selected for decimation are partially overwritten. This allows additional data records to be stored in the now-decimated portions of memory. Note that two records may be stored in a column selected to hold half rate data, for example each record occupying odd or even memory locations. The amount of original data of a particular memory portion that is overwritten in operation 822 is dependent on the present decimation rate. Such partial overwriting continues while operation 826 exits in the NO direction. Then, when operation 826 indicates that the memory is again full, or has again reached the fullness threshold, the flow 800 returns to operation 818, where additional portions of memory are selected for decimation, or where the same portions of memory are selected for decimation at a higher rate.

The flow 800 in FIG. 8 is illustrated without end, as, conceivably, the decimation of the acquisition memory could continue in perpetuity. As mentioned above, there may be some point in time where further decimation would make the data stored in the acquisition memory unusable, at least for some purposes. At such a point, the instrument 100 could start replacing the oldest data with the next oldest data, with each additional signal acquired. Or, the instrument could stop accepting additional data records and signal an alarm that the memory was full.

With reference back to FIG. 1, a thumbnail decimation process according to embodiments of the invention will be described in more detail. As mentioned above, the ADCs 104 may sample the input signal from the port 102 at more than one rate. Or, the data store processor 120 could decimate the signal sampled by the ADCs 104 at various rates. Regardless of the particular method used, the instrument 100 could effectively operate to simultaneously decimate the same input signal at two decimation rates, and store them in different locations. The two parallel signals could be linked to one another as an index to each other, as described below.

Assume that the data store processor 120 decimates the input signal from the ADC 104 at two different levels. The non, or lower-decimated output from the input signal will be referred to as a Long Record Length (LRL) sample and the more-decimated output from the input signal will be referred to as a Short Record Length (SRL) sample or thumbnail sample. The LRL sample may be functionally endlessly recorded in the acquisition memory 106, by using embodiments of the invention for memory decimation as discussed above. The thumbnail sample may be stored in a thumbnail storage 108, which may be a different memory than the acquisition memory 106, or may be a separate portion of the acquisition memory 106. In either case, the thumbnail sample and the LRL sample are linked together by timestamps or by other methods.

In one embodiment, the thumbnail sample is used by the instrument 100 to make a video display of the corresponding LRL sample on an output, such as the output display 114 or on a separate thumbnail output 124. The size of the thumbnail storage 108 and rate of the thumbnail decimation may be selected based on the screen pixels to be shown on the thumbnail output 124. By viewing a visual representation of the thumbnail sample on the thumbnail output 124, the user could have a physical view into the memory stored as the LRL sample, without the instrument 100 needing to generate the view from the LRL record itself. The user could adjust the thumbnail decimation process to their preferred settings for viewing, such as based on trigger settings, horizontal/timebase settings, vertical/amplifier settings, etc. The corresponding LRL sample would record the input signal at the highest, undecimated or with the lowest amount of decimation that the acquisition memory 106 allows. The LRL sample is stored without any triggers, and no settings applied to the recorded data, but rather the LRL sample is the raw digitized sample as received by the port 102 and sampled by the ADCs 104.

Because the LRL sample is recorded without filtering or additional processing, it is effectively the same as storing an exact copy of the input signal. In effect, and with reference to FIG. 1, the instrument 100 could operate on input data directly as it is digitized by the ADC 104, through a processor port 111, or it could operate on data retrieved from the acquisition memory 106, for example, through the data store processor 120 through a port 121, equally well. Meaning, since the acquisition memory 106 stores digitized input signals with precise fidelity, and, using techniques described above the acquisition memory 106 is very large, and effectively endless, the user of the instrument 100 can choose to view or process live or recorded data without any loss in fidelity.

For instance, as described above, triggers are a common way to identify anomalies in incoming data. For example, the electrical signal from a common house outlet is a sine wave that oscillates at 60 Hz between +/−170 v, to generate the familiar 120V RMS voltage equivalent. Assume that the input port 102 is connected to a standard Alternating Current (AC) outlet and the ADC 104 digitizes the sine wave input signal. The instrument 100 could store a very long sample of the digitized version of the input signal in its acquisition memory 106, especially since the sample rate could be very low based on the low frequency of the 60 Hz AC input signal. Assume that the instrument 100 could store over 1 week of input data from this device. The user may set trigger conditions 113 using inputs 112 to the main processor 120, and then instruct the instrument 100 to apply the stored LRL signal of the AC input signal to the trigger conditions. In this way the triggers 113 could be applied to the stored data after the data was stored, unlike conventional devices that store data only based on the satisfaction of the trigger. In this way the instrument 100 allows a much deeper analysis of the data, since additional triggers and other data analysis can be applied to the stored data after the raw input signal has already been stored. For example, assume that the user of the instrument 100 originally believed an anomaly occurred due to the AC input signal voltage temporarily exceeding 200 volts. In a conventional instrument, the user would set the trigger at, for example, 195 volts to gather the signal and possibly other information about the signal when the input signal approached 200 volts. But, in this example, also assume that the actual problem occurs when the AC input signal frequency increases beyond 75 Hz, regardless of the amplitude of the voltage. Using embodiments of the invention, a user of the instrument 100 could first store a long data set of the LRL AC input signal using embodiments of the invention as set forth above. Then, the user could set various triggers and then apply, or test, the stored data against those stored triggers. If the user did not find any trigger anomalies in the stored input signal, the user could devise a new set of triggers and perform further investigation by using the LRL stored in the acquisition memory 106 as many times as necessary until the anomaly was found.

In this sense, a user could also apply new settings to the recorded data. For example, to explore a new issue they weren't originally looking for. Often, a user might not know what they're looking for when they first capture the data. Or, the person doing the capture might not be trained or might not be looking for the same thing. Embodiments of the disclosure would allow those users to simply record the data, and apply or change the settings later, based on their needs at the time.

In another example, a user could leave an instrument 100, such as an oscilloscope recording over a weekend, and be notified on Monday if an anomaly occurred. This would be particularly useful for environmental testing of a DUT (e.g. temperature, humidity, etc), where various parameters get changed over time. In these types of tests, it's hard for the engineer user to anticipate what glitches or anomalies to look for ahead of time, so pre-configuring the oscilloscope settings, such as various triggers, is difficult. An instrument according to embodiments of the invention eliminates the burden of setting particular triggers or other tests that modify when or how the input signal is acquired. Instead, the instrument 100 merely records the incoming data for a very long time, perfectly or adequately capturing the signal for later testing. Such a device reduces the opportunity for error if the user chooses the wrong settings, as could happen using present instruments.

With reference to the thumbnail decimation described above, still other embodiments of the disclosure may also potentially record video data from the display as the thumbnail decimated data is presented on the thumbnail output 124. Such a video record, even of an SRL or thumbnail view gives the user a navigation aide when replaying the data, so they could see the same view they had before. This recorded thumbnail view would not be subject to or impacted by the decimation, filtering, etc. as described above with reference to LRL data, and the recorded thumbnail view would not change based on settings applied to data recorded by the LRL decimator. In the case of reduced sample rate, the video recording would not be affected by the lower sample rate used for the LRL data recording.

This thumbnail data could also be saved as an HD video stream of the output from the thumbnail output 124, effectively recording the thumbnail output as the instrument processes the input data. This video of the thumbnail data would occupy a much lower data size than the LRL data recording, and could be viewed by standard video players, including streaming video players on a network. It could also be timestamped. The video stream could also be linked to and/or synchronized with the LRL data, so that as a user plays the video data, they are walking through the recorded waveform data at the same time.

Further, triggers and other common tests for LRL data could be applied to the thumbnail playback data. For instance, if the thumbnail view of an input voltage signal had several large spikes, or other anomalies, the instrument 100 could be set to apply triggers or other tests to the thumbnail video data as it played on the thumbnail output 124.

In some embodiments of the invention, the instrument 100 or may be programmed or pre-set to automatically increase the decimation rate at which the data is being stored in the acquisition memory 106 based on the capacity of the acquisition memory. In this embodiment, the instrument could store incoming data at a first rate until a first capacity threshold of the acquisition memory 106 was exceeded, such as 50%, and then store further incoming data at a second rate that has a higher decimation rate than the first rate. This process could continue repeatedly storing incoming data at a higher decimation rate until a maximum decimation amount was received, and could then mark the memory as full, or could begin to overwrite the oldest data.

In other embodiments of the invention, the instrument 100 may be programmed or pre-set to match the decimation rate of the incoming data to a decimated-in-place rate of the data already stored in the acquisition memory 106. In this embodiment, the instrument 100 could store incoming data at a first rate until a first capacity threshold of the acquisition memory 106 was exceeded, such as 100%. Then, the instrument 100 could mark a portion of the samples stored in the acquisition memory 106 as available to be overwritten, which decimates-in-place the sample data already stored in the acquisition memory 106. Newly acquired sampled data is stored at the same decimation rate as the data that was just decimated. For example, data stored in the acquisition memory 106 is stored as half-rate data after the previously stored data was decimated by a factor of 2.

In yet other embodiments of the invention the instrument 100 may be programmed or pre-set to automatically age data as it is being stored in the acquisition memory 106 by decimating-in-place the oldest data, while still receiving and storing the latest data at the full data rate.

In all of these embodiments, the percent thresholds of fullness of the acquisition memory 106 for causing various decimation levels may be adjusted by the user, or pre-set by the instrument. Further, in all of these embodiments while described as being present in the instrument 100, could be performed by equivalent or similar functions by software running on one or more servers either on local devices or through an information network.

Figure 9:
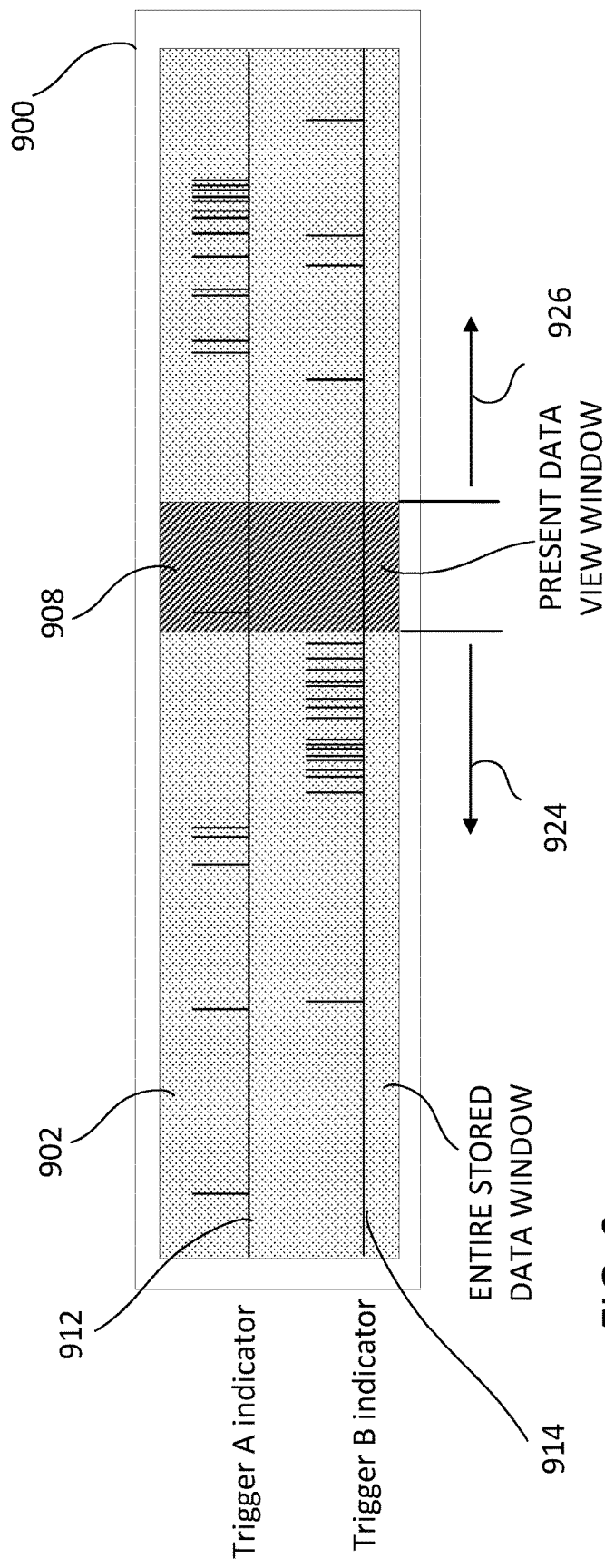
FIG. 9 is an illustration of an example data viewing window used by a continuously recording test and measurement device according to embodiments of the invention.
Figure 10:
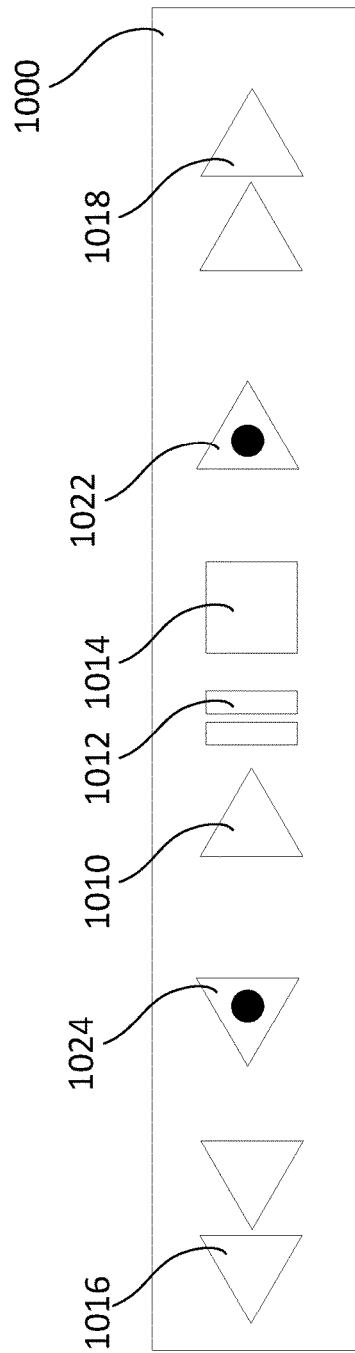
FIG. 10 is an illustration of example user controls presented to a user of a continuously recording test and measurement device according to embodiments of the invention.

FIGS. 9 and 10 describe other aspects of the disclosure, which includes tools for users to navigate the massive amount of data that is able to be stored in the acquisition memory according to embodiments of the invention.

FIG. 9 illustrates a display window 900 that conveys to a user a graphical display of data stored in the instrument 100. A window 902 shows a graphic view of all of the data stored in the instrument, while a segment 908 illustrates a graphical view of a present view window 908. In some embodiments, the present view window 908 may be a single pointer (not illustrated) that instead points to a location in the data where the instrument 100 will begin its playback or analysis. Further, the display window 900 includes graphical representations of trigger indicators 912, 914 where certain pre-set triggers have been violated by the data stored in the instrument 100.

With reference to FIG. 9, the present data view window 908 is between two clustered groups of trigger violations, or anomalies in the data. The Trigger B indicator 914 conveys to the user that a cluster of trigger violations appear to the 'left', i.e., earlier than the present viewing window 908. Similarly, the Trigger A indicator 912 indicates a cluster of trigger violations to the 'right' of the present viewing window 908, or later in the data stored in the acquisition memory 106.

The user may move the present data view window 908 relative to the entire stored data window 902 by dragging the present data view window with a pointer, such as a mouse or touchscreen. Or, the user may use forward/reverse controls 924, 926 to move the present view window to the desired starting point of the stored data.

Further, FIG. 10 illustrates that a set of VCR-like controls 1000, which may be an embodiment of data controls 122 (FIG. 1), that can be presented to the user to set a starting location of the data stored in the acquisition memory 106 or of a current view window as described above with reference to FIG. 9. The data controls 122 may be coupled to the data store processor 120 (FIG. 1). The data controls 122 may also control the thumbnail views as described above.

Specific controls may include fast forward 1018 and fast reverse, 1016. The controls may have various levels that may be selected by the user. For example pressing a mouse cursor or touchscreen while the fast forward control 1018 is selected could step through various speeds of forward. For example, there may be four different forward and reverse speeds, each selectable by the user. Other controls may include a play control 1010, pause 1012, and stop 1014. The play control 1010 causes the instrument 100 to begin its operations at the present location of the data controlled as set by the user using the other controls.

Still other controls include a forward seek 1022 and reverse seek 1024. These controls are set by the user through the control interface 122 or through the main user inputs 112 of FIG. 1. The forward and reverse seek 1022, 1024 search the data stored in the acquisition memory 106 in the selected direction to find occurrences in the data of trigger violations, or other anomalies set by the user. For example, the user may use the forward seek 1022 to find the next occurrence of when the stored input signal exceeds a preset voltage threshold. When the user enters the threshold trigger and selects the forward seek control 1022, the instrument 100 progresses through the stored acquisition signal comparing the signal level to the entered threshold. Then, the instrument 100 stops when the next threshold violation occurs. The user can set up multiple simultaneous triggers through the user controls 122 for use with forward and reverse seek, which may be a powerful tool to analyze the stored signal data.

Some embodiments of the disclosed technology may include triggered recording. In these embodiments, the user sets trigger criteria for LRL decimator. When the criteria are met, the LRL data is recorded into the acquisition memory 106, and the recording does not happen when criteria are not met. This could also be helpful when sending recordings remotely, to a PC or network server. In this manner the instrument 100 maintains the functionality of conventional instruments in addition to its new features.

In one embodiment, the LRL decimator would always record everything, but would only make portions of the recording persistent based on criteria. In another embodiment, the LRL decimator data could be written to a file or remote storage based on the criteria, for example, if a certain event occurs, the incoming data could be copied and sent out of the instrument 100 through one or more output ports 116 (FIG. 1). The data could then be sent to the cloud or to a remote data server 150, where it could be stored or transferred to other computer networks. Additionally, or alternatively, the instrument 100 could be configured to generate other types of notifications based on triggers, anomalies, or even violated/satisfied conditions of the thumbnail representation of the data described above. Examples of notifications include email, text messages, etc. Further, when the preset conditions are satisfied, configurable rules may be defined in the instrument through the user inputs 112 or user controls 122 about what data gets saved, how many samples are saved, what sample rate, etc.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a system including an input configured to receive a signal under test; an analog-to-digital converter configured to receive the signal under test and produce digitized samples; and one or more processors configured to adaptively decimate the digitized samples based on available acquisition memory capacity.

Example 2 is a system according to Example 1, in which the digitized samples are stored in the acquisition memory, and in which the one or more processors are configured to adaptively decimate the digitized samples by determining a portion of the digitized samples already stored in the acquisition memory are available to be overwritten.

Example 3 is a system according to Example 1, in which the digitized samples are stored in the acquisition memory at a first decimation rate, and in which the one or more processors are configured to adaptively decimate the digitized samples by storing additional digitized samples in the acquisition memory at a second decimation rate, the second decimation rate being different than the first decimation rate.

Example 4 is system according to Example 2 in which the digitized samples are stored in the acquisition memory, and in which the one or more processors are configured to adaptively decimate the digitized samples by determining a portion of the digitized samples already stored in the acquisition memory are available to be overwritten; and storing additional digitized samples in the areas of the acquisition memory that were determined to be available to be overwritten.

Example 5 is a system according to any of the preceding Examples, in which the one or more processors are configured to adaptively decimate the digitized samples by storing the additional digitized samples in the areas of the acquisition memory that were determined to be available to be overwritten at a rate based on how large of a portion of the digitized samples already stored in the acquisition memory were determined to be available to be overwritten.

Example 6 is a system according to any of the preceding Examples, in which half of the number of the digitized samples already stored in the acquisition memory were determined to be available to be overwritten, and in which the decimation rate of the additional digitized samples to be stored in the acquisition memory is twice the previous rate.

Example 7 is a system according to any of the preceding Examples, in which determining a portion of the digitized samples already stored in the acquisition memory are available to be overwritten comprises determining any amount of the digitized samples already stored in the acquisition memory are available to be overwritten.

Example 8 is a system according to any of the preceding Examples, in which determining any amount of the digitized samples already stored in the acquisition memory are available to be overwritten comprises determining half of the digitized samples already stored in the acquisition memory are available to be overwritten.

Example 9 is a system according to any of the preceding Examples, in which the one or more processors are further structured to store a copy of the digitized sample in a memory of the system, the copy of the digitized sample having a different decimation rate than the digitized sample.

Example 10 is a system according to Example 9, further comprising a display configured to show a video representation generated from the copy of the digitized sample.

Example 11 is a system according to Examples 9 or 10, further comprising a trigger facility structured to set a trigger based on the video representation generated from the copy of the digitized sample.

Example 12 is a method including receiving a signal under test at a test input; producing digitized samples of the signal under test; and adaptively decimating the digitized samples based on available acquisition memory capacity.

Example 13 is a method according to Example 12, in which the digitized samples are stored in the acquisition memory, and in which adaptively decimating the digitized samples comprises determining that a portion of the stored digitized samples are available to be overwritten.

Example 14 is a method according to Example 12, further comprising storing the digitized samples in the acquisition memory at a first decimation rate, and in which adaptively decimating the digitized samples comprises storing additional digitized samples in the acquisition memory at a second decimation rate, the second decimation rate being different than the first decimation rate.

Example 15 is a method according to any of the preceding Examples 12-14, in which the digitized samples are stored in the acquisition memory, and in which adaptively decimating the digitized samples comprises determining a portion of the digitized samples already stored in the acquisition memory are available to be overwritten; and storing additional digitized samples in the areas of the acquisition memory that were determined to be available to be overwritten.

Example 16 is a method according to any of the preceding Examples 12-15, in which adaptively decimating the digitized samples comprises storing the additional digitized samples in the areas of the acquisition memory that were determined to be available to be overwritten at a rate based on how large of a portion of the digitized samples already stored in the acquisition memory were determined to be available to be overwritten.

Example 17 is a method according to Example 16 in which half of the number of the digitized samples already stored in the acquisition memory were determined to be available to be overwritten, and further comprising storing the additional digitized samples in the acquisition memory at a rate that is twice the previous rate.

Example 18 is a method according to Example 13, in which determining that a portion of the stored digitized samples are available to be overwritten comprises determining any amount of the digitized samples already stored in the acquisition memory are available to be overwritten.

Example 19 is a method according to Example 18 in which determining any amount of the digitized samples already stored in the acquisition memory are available to be overwritten comprises determining half of the digitized samples already stored in the acquisition memory are available to be overwritten.

Example 20 is a method according to Example 12 further comprising storing a copy of the digitized samples in a memory of the system, the copy of the digitized samples having a different decimation rate than the digitized samples.

Example 21 is a method according to Example 20, further comprising showing a video representation generated from the copy of the digitized sample on a display.

Example 22 is a method according to Example 21, further comprising setting a trigger based on the video representation generated from the copy of the digitized sample.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

The invention claimed is:

1. A system comprising:
an input configured to receive a signal under test;
an analog-to-digital converter configured to receive the signal under test and produce digitized samples;
an acquisition memory; and
one or more processors configured to adaptively decimate the digitized samples in the acquisition memory based on available capacity of the acquisition memory,
in which the digitized samples are stored in the acquisition memory at a first decimation rate, and in which the one or more processors are configured to adaptively decimate the digitized samples by:
storing additional digitized samples in the acquisition memory at a second decimation rate, the second decimation rate being different than the first decimation rate,
determining a portion of the digitized samples already stored in the acquisition memory is available to be overwritten; and
storing additional digitized samples in the areas of the acquisition memory that are determined to be available to be overwritten at the second decimation rate based on how large of a portion of the digitized samples already stored in the acquisition memory is determined to be available to be overwritten,
in which half of a number of the digitized samples already stored in the acquisition memory is determined to be available to be overwritten, and in which the second decimation rate is twice the first decimation rate.

2. The system according to claim 1 in which the one or more processors are further structured to store a copy of the digitized samples in a memory of the system, the copy of the digitized samples having a different decimation rate than the digitized samples.

3. The system according to claim 2, further comprising a display configured to show a video representation generated from the copy of the digitized sample.

4. The system according to claim 3, further comprising a trigger facility structured to set a trigger based on anomalies observed in the video representation generated from the copy of the digitized sample.

5. A method comprising:
receiving a signal under test at a test input;
producing digitized samples of the signal under test;
storing the digitized samples in an acquisition memory;
adaptively decimating the digitized samples based on available acquisition memory capacity, in which the digitized samples are stored in the acquisition memory at a first decimation rate, and in which adaptively decimating the digitized samples comprises:
storing additional digitized samples in the acquisition memory at a second decimation rate, the second decimation rate being different than the first decimation rate;
determining a portion of the digitized samples already stored in the acquisition memory is available to be overwritten, storing additional digitized samples in the areas of the acquisition memory that are determined to be available to be overwritten; and
storing the additional digitized samples in the areas of the acquisition memory that are determined to be available to be overwritten at the second decimation rate based on how large of a portion of the digitized samples already stored in the acquisition memory is determined to be available to be overwritten;
in which half of a number of the digitized samples already stored in the acquisition memory is determined to be available to be overwritten, and in which the second decimation rate is twice the first decimation rate.

6. The method according to claim 5, further comprising storing a copy of the digitized samples in a second memory of the system, the copy of the digitized samples having a different decimation rate than the digitized samples.

7. The method according to claim 5, further comprising showing a video representation generated from the copy of the digitized sample on a display.

8. The method according to claim 7, further comprising setting a trigger based on anomalies observed in the video representation generated from the copy of the digitized sample.

* * * * *